(12) United States Patent
Fishburn et al.

(10) Patent No.: US 12,473,644 B2
(45) Date of Patent: Nov. 18, 2025

(54) GROWTH OF THIN OXIDE LAYER WITH SILICON NITRIDE AND CONVERSION

(71) Applicant: Applied Materials, Inc., Santa Clara, CA (US)

(72) Inventors: Fredrick Fishburn, Aptos, CA (US); Hao Zhang, San Diego, CA (US); Zhijun Chen, San Jose, CA (US); Johanes Swenberg, Los Gatos, CA (US); Christopher S. Olsen, Fremont, CA (US); Hansel Lo, San Jose, CA (US); Kristopher Mikael Koskela, San Jose, CA (US); Hoi-Sung Chung, Sunnyvale, CA (US); Chang Seok Kang, San Jose, CA (US); Raghuveer Satya Makala, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 79 days.

(21) Appl. No.: 18/652,608

(22) Filed: May 1, 2024

(65) Prior Publication Data

US 2025/0075321 A1     Mar. 6, 2025

Related U.S. Application Data

(60) Provisional application No. 63/535,933, filed on Aug. 31, 2023.

(51) Int. Cl.
C23C 16/455 (2006.01)
C23C 16/04 (2006.01)
(Continued)

(52) U.S. Cl.
CPC ...... *C23C 16/45536* (2013.01); *C23C 16/045* (2013.01); *C23C 16/345* (2013.01); *C23C 16/45553* (2013.01); *C23C 16/56* (2013.01)

(58) Field of Classification Search
None
See application file for complete search history.

(56) References Cited

U.S. PATENT DOCUMENTS

| 11,569,245 B2 | 1/2023 | Olsen |
| 2015/0072502 A1* | 3/2015 | Jang ............... H10B 12/488 438/424 |
| 2019/0067293 A1 | 2/2019 | Lin et al. |

FOREIGN PATENT DOCUMENTS

| CN | 112951827 A | 6/2021 |
| KR | 20130059790 A | 6/2013 |
| KR | 20170043683 A | 4/2017 |

OTHER PUBLICATIONS

International Search Report and Written Opinion dated Oct. 28, 2024 for Application No. PCT/US2024/038795.

* cited by examiner

*Primary Examiner* — Michael G Miller
(74) *Attorney, Agent, or Firm* — Patterson + Sheridan, LLP

(57) ABSTRACT

A method for forming an oxide layer includes forming a protective interlayer oxide on sidewalls of a trench formed on a substrate, forming a silicon nitride layer on the protective interlayer oxide, by a plasma-enhanced atomic layer deposition (PE ALD) process utilizing nitrogen-containing process gas, the silicon nitride layer having a concentration gradient of nitrogen varying from high concentration away from the protective interlayer oxide to low concentration near the protective interlayer oxide, and performing a conversion process to oxidize the formed silicon nitride layer to at least partially convert the formed silicon nitride layer to a silicon oxide layer.

23 Claims, 5 Drawing Sheets

(51) Int. Cl.
*C23C 16/34* (2006.01)
*C23C 16/56* (2006.01)

GROWTH OF THIN OXIDE LAYER WITH SILICON NITRIDE AND CONVERSION

CROSS-REFERENCE TO RELATED APPLICATIONS

This application claims priority to U.S. Provisional Application Ser. No. 63/535,933 filed Aug. 31, 2023, which is herein incorporated by reference in its entirety.

BACKGROUND

Field

Embodiments described herein generally relate to semiconductor device fabrication, and more particularly, to methods of forming a high quality thin oxide layer in a high aspect ratio semiconductor structure.

Description of the Related Art

The production of silicon integrated circuits has placed difficult demands on fabrication processes to increase the number of devices while decreasing the minimum feature sizes on a chip. These demands have extended to fabrication processes including depositing layers onto difficult topologies while maintaining device reliability. For example, a buried wordline (bWL) structure used in dynamic random access memory (DRAM) devices may have an aspect ratio of 6:1, 10:1, or more and require a gate oxide layer that is thin and reliable.

Conventional methods of forming an oxide layer in such structures suffer from one or more of three issues. The first issue is high silicon consumption for thermal oxidation growth. That is, an oxide layer may not be formed thin enough for a high aspect ratio structure. The second issue is low quality of a formed oxide layer by deposition, which may include defects and traps within, thus leading to reduced device reliability. The third issue is low and non-uniform nitrogen incorporation in an oxide layer.

Thus, there is a need for improved processes for forming a thin high quality oxide layer, minimizing silicon consumption and defects in the formed oxide layer and allowing control over nitride incorporation in the oxide layer.

SUMMARY

Embodiments of the present disclosure provide a method for forming an oxide layer. The method includes forming a protective interlayer oxide on sidewalls of a trench formed on a substrate, forming a silicon nitride layer on the protective interlayer oxide, by a plasma-enhanced atomic layer deposition (PE ALD) process utilizing nitrogen-containing process gas, the silicon nitride layer having a concentration gradient of nitrogen varying from high concentration away from the protective interlayer oxide to low concentration near the protective interlayer oxide, and performing a conversion process to oxidize the formed silicon nitride layer to at least partially convert the formed silicon nitride layer to a silicon oxide layer.

Embodiments of the present disclosure also provide a method for forming an oxide layer. The method includes forming a protective interlayer oxide on sidewalls of a trench formed on a substrate, forming a bi-layer of a bottom nitrogen-rich silicon nitride layer on the protective interlayer oxide and a top silicon nitride layer on the bottom nitrogen-rich silicon nitride layer, by an atomic layer deposition (ALD) process, and performing a conversion process to oxidize the formed bottom nitrogen-rich silicon nitride layer to convert the formed bottom nitrogen-rich silicon nitride layer to a silicon oxide layer.

Embodiments of the present disclosure further provide a method for forming an oxide layer. The method includes forming a protective interlayer oxide on sidewalls of a trench formed on a substrate, and forming a hybrid-layer of a bottom silicon nitride layer on layer on the protective interlayer oxide and a top silicon oxide layer on the bottom silicon nitride layer, by an atomic layer deposition (ALD) process, and performing a conversion process to oxidize the formed bottom silicon nitride layer to convert the formed bottom silicon nitride layer to a silicon oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein are directed to methods of forming a high quality thin oxide layer in a semiconductor device, such as a buried wordline (bWL) structure used in a dynamic random access memory (DRAM) device, and a thin nanowire field-effect-transistor (FET). A thin oxide layer that may be used as a gate oxide layer in such devices may be formed by first depositing a silicon nitride layer on a substrate and then oxidizing the silicon nitride layer by a conversion process.

The methods described herein for forming a thin oxide layer may reduce silicon consumption and increase quality of the formed oxide layer, thus enabling a gate oxide scaling with improved reliability. The methods described herein also provide the capability of selectively tuning a thickness and nitride incorporation distribution of an oxide layer. For example, a gate oxide layer formed on sidewalls of a trench can have a uniform nitrogen concentration from a top of the trench to a bottom of the trench or can have a controlled level of nitrogen concentration, if desired.

Figure 1:
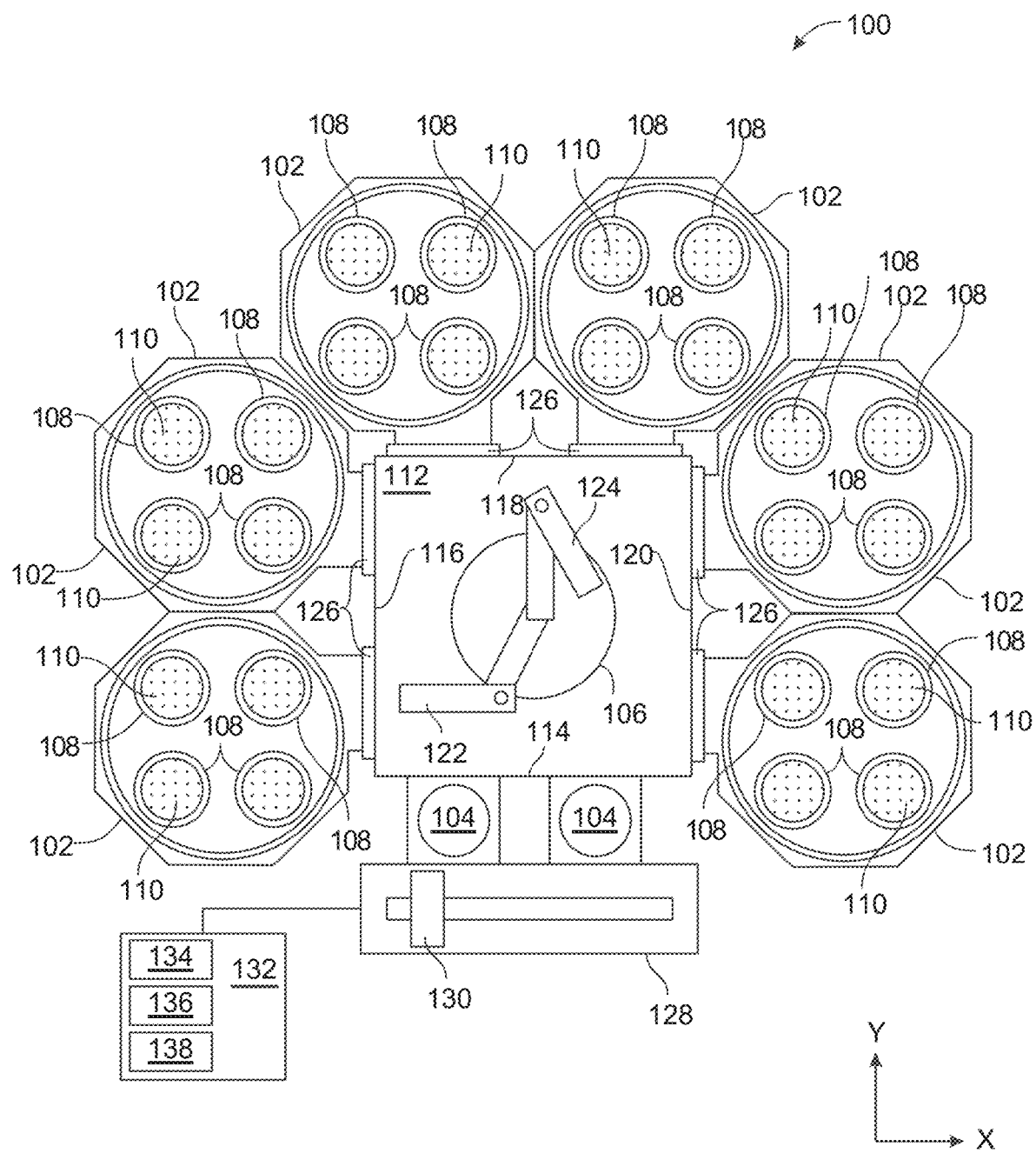
FIG. 1 is a schematic view of a substrate processing system according to one embodiment.

FIG. 1 shows a processing platform 100 in accordance with one or more embodiments of the disclosure. The embodiment shown in FIG. 1 is merely representative of one possible configuration and should not be taken as limiting the scope of the disclosure. For example, in some embodiments, the processing platform 100 has a different number of processing chambers 102, buffer stations 104 and/or robot 106 configurations different from the illustrated embodiment.

The processing chamber 102 includes a plurality of processing stations 108. The processing stations 108 are spatially separated in an interior volume 110 within the processing chamber 102. Each processing station 108 independently has a processing chamber temperature that can be different from the other processing station temperatures.

The processing stations 108 can be configured to perform any suitable process and provide any suitable process conditions. For example, a processing station 108 configured to operate as an atomic layer deposition (ALD) apparatus may have a showerhead or vortex type gas injector. Whereas, a processing station 108 configured to operate as a plasma station may have one or more electrode and/or grounded plate configuration to generate a plasma while allowing a plasma gas to flow toward the wafer. Suitable processing stations 108 include, but are not limited to, an inductively coupled plasma (ICP) process station, a capacitively coupled plasma (CCP) process station, an etch soak process station, a thermal process station, a microwave plasma station, a UV exposure station, a laser process station, a pumping chamber station, an annealing station, and a metrology station.

The exemplary processing platform 100 includes a central transfer station 112 which has a plurality of sides 114, 116, 118, 120. The central transfer station 112 shown has a first side 114, a second side 116, a third side 118 and a fourth side 120. Although four sides are shown, those skilled in the art will understand that there can be any suitable number of sides to the central transfer station 112 depending on, for example, the overall configuration of the processing platform 100. In some embodiments, the transfer station 112 has three sides, four sides, five sides, six sides, seven sides or eight sides.

The transfer station 112 has a robot 106 positioned therein. The robot 106 can be any suitable robot capable of moving a wafer during processing. In some embodiments, the robot 106 has a first arm 122 and a second arm 124. The first arm 122 and the second arm 124 can be moved independently of the other arm. The first arm 122 and the second arm 124 can move in the X-Y plane and/or along the Z-axis. In some embodiments, the robot 106 includes a third arm (not shown) or a fourth arm (not shown). Each of the arms can move independently of other arms.

The embodiment illustrated includes six processing chambers 102 with two connected to each of the second side 116, the third side 118, and the fourth side 120 of the central transfer station 112. Each of the processing chambers 102 can be configured to perform different processes.

The processing platform 100 can also include one or more buffer stations 104 connected to the first side 114 of the central transfer station 112. The buffer stations 104 can perform the same or different functions. For example, the buffer stations 104 may hold a cassette of wafers which are processed and returned to the original cassette, or one of the buffer stations 104 may hold unprocessed wafers which are moved to the other buffer station 104 after processing. In some embodiments, one or more of the buffer stations 104 are configured to pre-treat, pre-heat or clean the wafers before and/or after processing.

The processing platform 100 may also include one or more slit valves 126 between the central transfer station 112 and any of the processing chambers 102. The slit valves 126 can open and close to isolate the interior volume 110 within the processing chamber 102 from the environment within the central transfer station 112. For example, if the processing chamber 102 generates plasma during processing, it may be helpful to close the slit valve 126 for that processing chamber 102 to prevent stray plasma from damaging the robot 106 in the central transfer station 112.

The processing platform 100 can be connected to a factory interface 128 to allow wafers or cassettes of wafers to be loaded into the processing platform 100. A robot 130 within the factory interface 128 can be used to move the wafers or cassettes into and out of the buffer stations 104. The wafers or cassettes can be moved within the processing platform 100 by the robot 106 in the central transfer station 112. In some embodiments, the factory interface 128 is a central transfer station 112 of another cluster tool (i.e., another multiple chamber processing platform).

A controller 132 may be provided and coupled to various components of the processing platform 100 to control the operation thereof. The controller 132 can be a single controller that controls the entire processing platform 100, or multiple controllers that control individual portions of the processing platform 100. For example, the processing platform 100 may include separate controllers for each of the individual processing chambers 102, the central transfer station 112, the factory interface 128, and the robots 106.

In some embodiments, the controller 132 includes a central processing unit (CPU) 134, a memory 136, and support circuits 138. The controller 132 may control the processing platform 100 directly, or via computers (or controllers) associated with particular process chamber and/or support system components.

The controller 132 may be one of any form of general-purpose computer processor that can be used in an industrial setting for controlling various chambers and sub-processors. The memory 136 or computer readable medium of the controller 132 may be one or more of readily available memory such as random access memory (RAM), read only memory (ROM), floppy disk, hard disk, optical storage media (e.g., compact disc or digital video disc), flash drive, or any other form of digital storage, local or remote. The memory 136 can retain an instruction set that is operable by the processor (CPU 134) to control parameters and components of the processing platform 100.

The support circuits 138 are coupled to the CPU 134 for supporting the processor in a conventional manner. These circuits include cache, power supplies, clock circuits, input/output circuitry and subsystems, and the like. One or more processes may be stored in the memory 136 as software routine that, when executed or invoked by the processor, causes the processor to control the operation of the processing platform 100 or individual processing chambers in the manner described herein. The software routine may also be stored and/or executed by a second CPU (not shown) that is remotely located from the hardware being controlled by the CPU 134.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 132 has one or more configurations to execute individual processes or sub-processes to perform the method. The controller 132 can be connected to and configured to operate intermediate components to perform the functions of the methods. For example, the controller 132 can be connected to and configured to control one or more of gas valves, actuators, motors, slit valves, vacuum control or other components.

Figure 2:
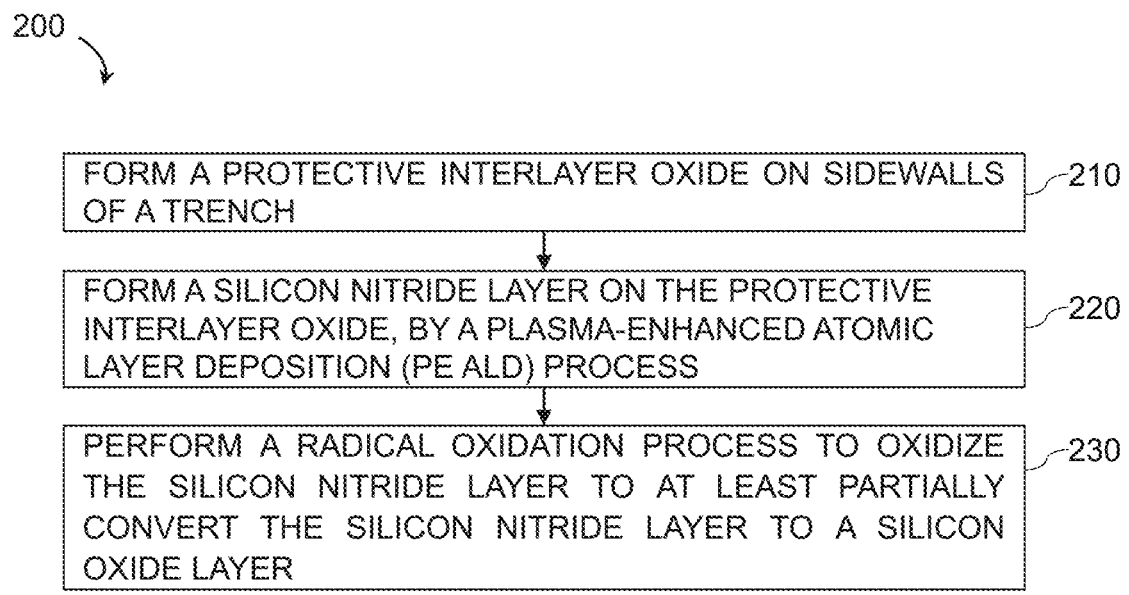
FIG. 2 is a process flow diagram of a method of forming an oxide layer in a semiconductor structure according to one embodiment.
Figure 3A:
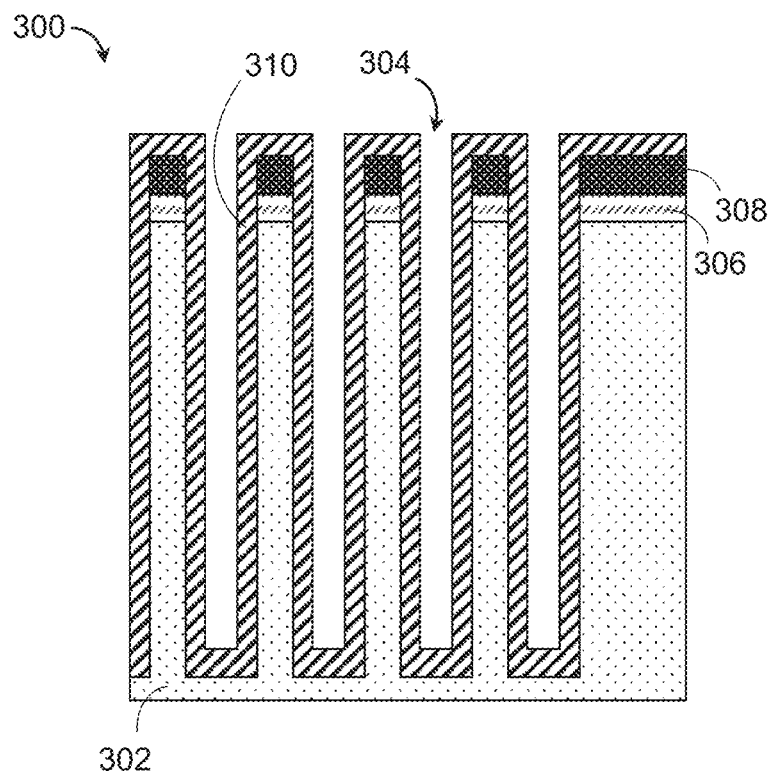
FIGS. 3A, 3B, 3C, and 3D are schematic views of a buried wordline (bWL) structure according to one embodiment.
Figure 3B:
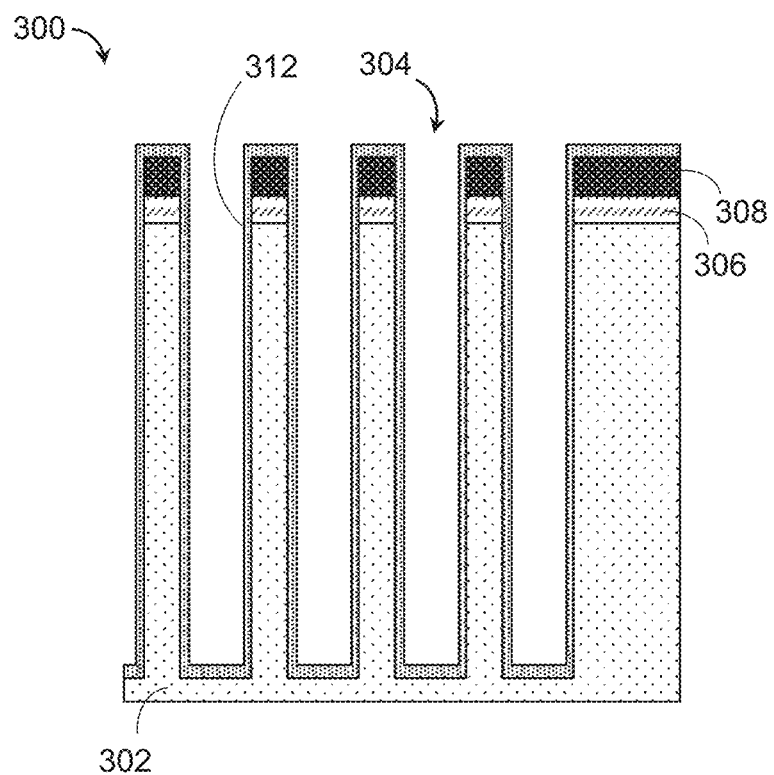
Figure 3C:
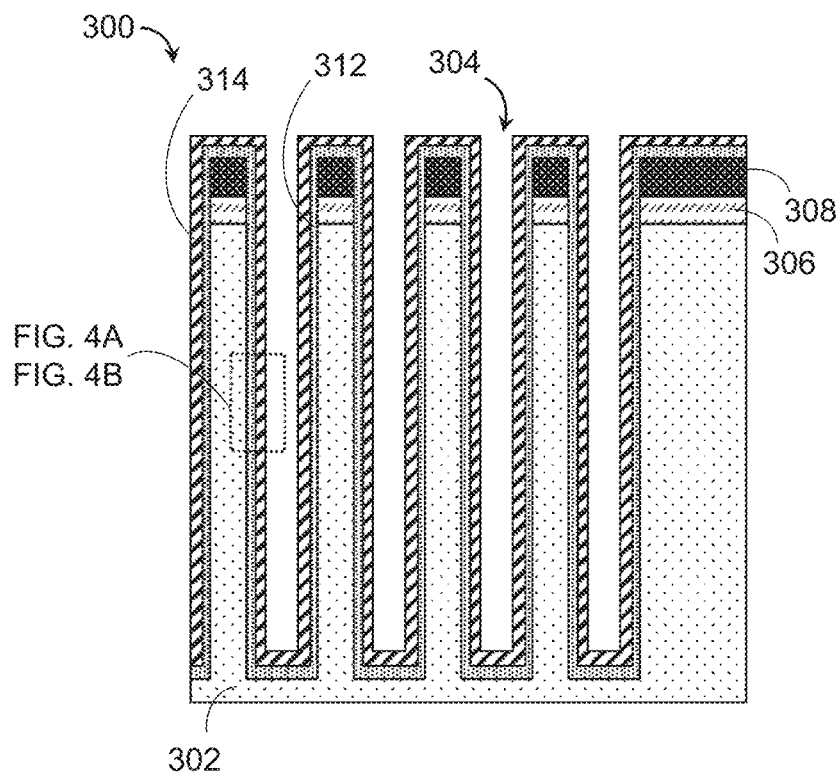
Figure 3D:
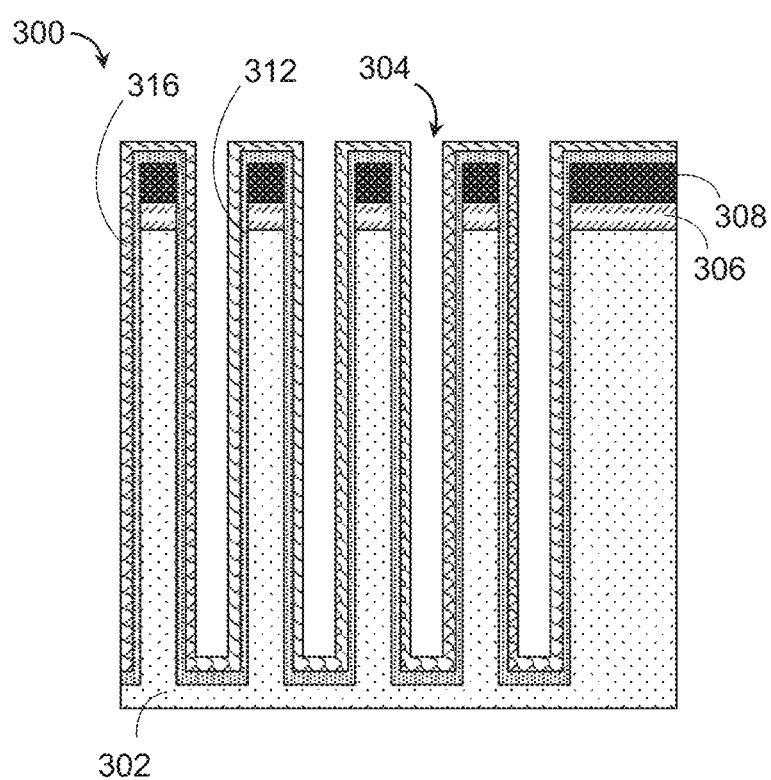

FIG. 2 is a process flow diagram of a method 200 of forming an oxide layer in a semiconductor structure, such as a buried wordline (bWL) structure 300 shown in FIG. 3A or any subset of the bWL structure 300, according to one or more implementation of the present disclosure. FIGS. 3B, 3C, and 3D are cross-sectional views of a portion of the bWL structure 300 corresponding to various stages of the method 200. The bWL structure 300 may be used in a dynamic random access memory (DRAM) device. Additionally, the method 200 may be used to form bWL structures having different configurations or other semiconductor devices, such as nanowires, that require a high-quality thin oxide layer. Further, it should also be understood that the operations depicted in FIG. 2 may be performed simultaneously and/or in a different order than the order depicted in FIG. 2.

The bWL structure 300 includes a substrate 302 having one or more trenches 304 formed thereon. In some implementations, the substrate 302 may have a substantially planar surface, an uneven surface, or a substantially planar surface having a structure formed thereon. The substrate 302 may be a material such as crystalline silicon (e.g., Si<100> or Si<111>), doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 302 may have various shapes and dimensions, such as 200 mm or 300 mm diameter wafers and rectangular or square panels. Unless otherwise noted, implementations and examples described herein refer to substrates having a 300 mm diameter. In some implementations, the substrate 302 may be a crystalline silicon substrate (e.g., monocrystalline silicon or polycrystalline silicon).

The trenches 304 may have a width of between about 8 nm and 15 nm, a depth of between about 80 nm and about 160 nm, and thus an aspect ratio of greater than about 6:1, or 10:1.

On the upper surface of the substrate 302, a pad oxide layer 306 and a nitride layer 308 are formed. The pad oxide layer 306 may be formed of silicon oxide ($SiO_2$). The nitride layer 308 may be formed of silicon nitride ($Si_3N_4$). On the upper surface of the substrate 302 and inner surfaces of the trenches 304, a gate oxide layer 310 is formed.

In a conventional method of forming the gate oxide layer 310, silicon oxide is deposited by an ALD or a CVD process using a silicon containing precursor and an oxygen containing precursor in gas phases, and densified by anneal. Subsequently, nitrogen is incorporated in the silicon oxide by a remote plasma and a thermal method. The resultant silicon oxide has relatively low and non-uniform nitrogen incorporation. In particular, silicon oxide formed on sidewalls of a high aspect ratio trench may have a large variation of nitrogen content between the bottom of the trench and the top of the trench. Furthermore, the deposited silicon oxide may include stoichiometric and structural defects (due to interruption of the tetrahedral crystalline structures of the silicon oxide formed by an ALD or a CVD process), border traps at a distance of between about 10 Å and about 15 Å from the interface with the substrate 302, and interface traps at the interface (e.g., within about 5 Å from the interface), leading to reduced device reliability of the bWL structure 300. A radical oxidation process and/or anneal process may reduce the defects in the deposited silicon oxide, but the treatment is effective only at a top surface of the deposited silicon oxide to a depth of between about 10 Å and about 30 Å, thus the device reliability may not be significantly improved.

In the embodiments described herein, the gate oxide layer 310 is formed by first depositing a silicon nitride layer on the substrate 302, and then converting the deposited silicon nitride layer by a conversion process. Since the method 200 does not include deposition of silicon oxide directly on the substrate, the formed gate oxide layer 310 is free from defects and traps. Furthermore, nitrogen incorporation in the gate oxide layer 310 is performed by a plasma-enhanced atomic layer deposition (PE ALD) process using nitrogen-containing process gas of a combination of nitrogen ($N_2$) and ammonia ($NH_3$) gases. By controlling content ratio of nitrogen ($N_2$) and ammonia ($NH_3$) gases, nitrogen content distribution (e.g., uniform from the bottom of a trench to the top of the trench) may be controlled and adjusted.

The method 200 begins in block 210, in which a protective interlayer oxide 312 is formed on sidewalls of the trench 304 and the exposed surface of the substrate 302 to at least partially fill the trench 304, as shown in FIG. 3B. The protective interlayer oxide 312 may be formed of silicon oxide ($SiO_2$) having a thickness of between about 5 Å and about 15 Å, by thermal oxidation growth. The protective interlayer oxide 312 may regulate amount of nitrogen atoms incorporated in the gate oxide layer 310 to be formed from high concentration away from the protective interlayer oxide 312 to low concentration near the protective interlayer oxide 312.

In block 220, a silicon nitride layer 314 is formed on the protective interlayer oxide 312, as shown in FIG. 3C.

In some embodiments, the silicon nitride layer 314 has a concentration gradient of nitrogen varying from high concentration away from the protective interlayer oxide 312 to low concentration near the protective interlayer oxide 312. The silicon nitride layer 314 is formed by a plasma-enhanced atomic layer deposition (PE ALD) process, which may be performed in a processing station, such as one of the processing stations 108 shown in FIG. 1. Due to the nature of ALD, the silicon nitride layer 314 has a thickness at the bottom that is substantially the same as a thickness on the sidewalls of the trench 304. The silicon nitride layer 314 may be formed of silicon nitride ($Si_3N_4$) having a thickness of between about 5 Å and about 25 Å, depending on a desired thickness of the gate oxide layer 310 to be formed.

A PE ALD process, utilizing nitrogen-containing process gas, and carrier gas including argon (Ar) (100-60%), is performed for a plasma time of between 0 seconds and about 10 seconds, at a temperature of between about 300° C. and about 650° C. under a chamber pressure of between about 50 mTorr and about 20 Torr. The substrate 302 is exposed to dichlorosilane (DCS) gas for about 100 ms and about 5 sec. The nitrogen-containing process gas may include nitrogen ($N_2$) only, ammonia ($NH_3$) (0-20%) and nitrogen ($N_2$), or ammonia ($NH_3$) only. The use of nitrogen ($N_2$) gas, forming nitrogen radicals, and ammonia ($NH_3$) gas, forming amino radical ($NH_2$·), may result in different nitrogen content in a deposited silicon nitride layer. Thus, nitrogen content and/or nitrogen content distribution in a deposited silicon nitride layer may be controlled and adjusted at a predetermined nitrogen content distribution as desired, by choosing content ratios of nitrogen ($N_2$) and ammonia ($NH_3$) in the nitrogen-containing process gas.

After a cycle of a PE ALD process, one or more cycles are repeated with a purge of between 0 second and about 10 seconds between cycles, until a desired thickness of the silicon nitride layer 314 is achieved. In a PE ALD process, conformity of a deposited silicon nitride layer increases as a cycle is repeated.

Figure 4A:
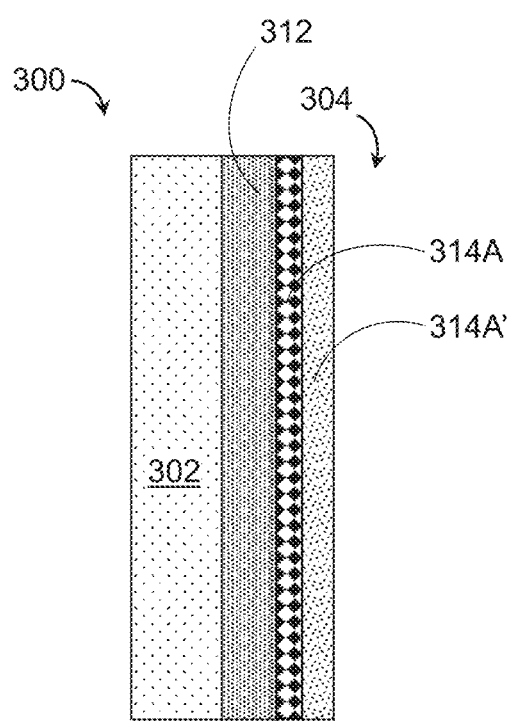
FIGS. 4A and 4B are schematic view of a portion of a buried wordline (bWL) structure according to one embodiment.

In some other embodiments, the silicon nitride layer 314 is a bi-layer of a bottom nitrogen-rich silicon nitride layer 314A on the protective interlayer oxide 312 and a top silicon nitride layer 314A' on the bottom nitrogen-rich silicon nitride layer 314A, as shown in FIG. 4A.

The bottom nitrogen-rich silicon nitride layer 314A may have nitrogen concentration of between about 15 atomic percent (at %) and about 60 at %, below stoichiometric concentration of silicon nitride ($Si_3N_4$).

The top silicon nitride layer 314A' may have nitrogen concentration of between about 5 atomic percent (at %) and about 25 at %.

The bi-layer of the bottom nitrogen-rich silicon nitride layer 314A and the top silicon nitride layer 314A' may be formed by an atomic layer deposition (ALD) process in two steps, in a processing station, such as one of the processing stations 108 shown in FIG. 1.

In the first step of the ALD process, the bWL structure 300 is exposed to a silicon-containing precursor and a nitrogen source, to form the bottom silicon nitride layer 314B. The silicon-containing precursor may include silane ($SiH_4$), disilane ($Si_2H_6$), tetrasilane ($Si_4H_{10}$), or a combination thereof. The nitrogen source may be such as ammonia ($NH_3$) or nitrogen ($N_2$).

In the second step of the ALD process, the bWL structure 300 is exposed to a silicon-containing precursor, to form the top silicon oxide layer 314B'. The silicon-containing precursor may include silane ($SiH_4$), disilane ($Si_2H_6$), tetrasilane ($Si_4H_{10}$), or a combination thereof.

Figure 4B:
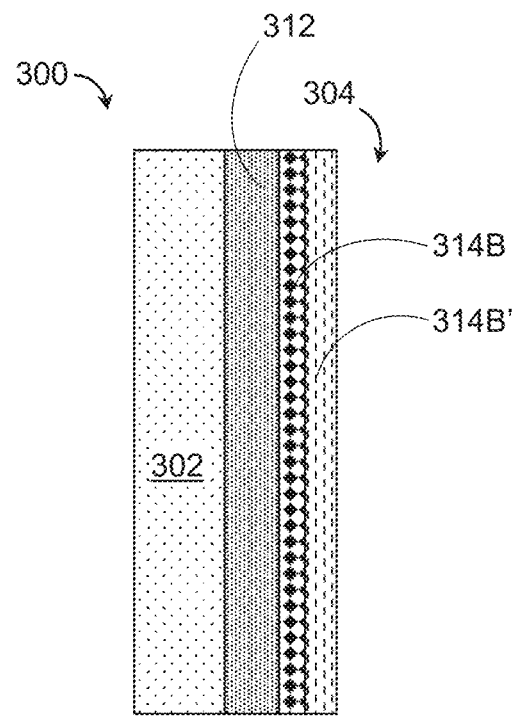

In some other embodiments, the silicon nitride layer 314 is a hybrid layer of a bottom silicon nitride layer 314B on the protective interlayer oxide 312 and a top silicon oxide layer 314B' on the bottom silicon nitride layer 314B, as shown in FIG. 4B.

The bottom silicon nitride layer 314B may have a thickness of between about 5 Å and about 20 Å.

The top silicon oxide layer 314B' may have a thickness of between about 5 Å and about 20 Å.

The hybrid layer of the bottom silicon nitride layer 314B and the top silicon oxide layer 314B' may be formed by an atomic layer deposition (ALD) process in two steps, in a processing station, such as one of the processing stations 108 shown in FIG. 1.

In the first step of the ALD process, the bWL structure 300 is exposed to a silicon-containing precursor and a nitrogen source, to form the bottom silicon nitride layer 314B. The silicon-containing precursor may include silane ($SiH_4$), disilane ($Si_2H_6$), tetrasilane ($Si_4H_{10}$), or a combination thereof. The nitrogen source may be such as ammonia ($NH_3$) or nitrogen ($N_2$).

In the second step of the ALD process, the bWL structure 300 is exposed to a silicon-containing precursor and oxygen source, to form the top silicon oxide layer 314B'. The silicon-containing precursor may include silane ($SiH_4$), disilane ($Si_2H_6$), tetrasilane ($Si_4H_{10}$), or a combination thereof. The oxygen source may include water ($H_2O$) or ozone ($O_3$).

In block 230, a conversion process is performed, in which the silicon nitride layer 314 is oxidized to at least partially convert the silicon nitride layer 314 to a silicon oxide layer 316 at an interface on the protective interlayer oxide 312, as shown in FIG. 3D, by a plasma radical oxidation process, such as remote plasma oxidation (RPO), or a thermal radical oxidation process, such as an in-situ steam generation (ISSG) process utilizing hydrogen ($H_2$) and oxygen ($O_2$) gases. The conversion process may be performed in a processing station, such as one of the processing stations 108 shown in FIG. 1. The silicon oxide layer 316 may be used as a gate oxide layer 310 as shown in FIG. 3A.

In a plasma radical oxidation process, oxygen radicals (O*) are directed to the formed silicon nitride layer 314 formed on at the interface on the protective interlayer oxide 312 within the trench 304, and thus the oxidation of the silicon nitride layer 314 occurs. In some embodiments, the plasma radical oxidation process may use an oxidizing agent including oxygen ($O_2$), nitric oxide (NO), nitrous oxide ($N_2O$), or the like, to provide oxygen radicals (O*). These may be used alone or in a combination thereof. Further, the plasma radical oxidation process may use a source gas for generating plasma including any combination of hydrogen ($H_2$) (of content ratio of 0% and about 80%), argon (Ar), helium (He), and xenon (Xe), among others. These may be used alone or in a combination thereof. In some embodiments, the plasma radical oxidation process may allow an oxidation reaction at a temperature of between about 900° C. and 1500° C. for a soak time of between about 3 seconds and about 3 minutes, to ensure high quality of the oxidized silicon.

In some embodiments, the plasma radical oxidation process may be performed under a pressure of between about 500 mTorr and about 10 Torr. The pressure may control an influx of the oxidizing agent introduced into the trench 304. The influx of the oxidizing agent into the trench 304 may be controlled also by applying a bias during the plasma radical oxidation process. Thus, a thickness and nitrogen content of the silicon oxide layer 316 may be controlled and adjusted as desired, by adjusting oxidation temperature and oxidation time of the plasma radical oxidation process. For example, a plasma radial oxidation process at a higher oxidation temperature and a longer oxidation time duration leads to a thicker silicon oxide layer 316. The nitrogen content increases with increased thickness of a silicon nitride layer 314 and nitrogen content increases with decreased oxidation time and decreased oxidation temperature.

The thermal radical oxidation process may be a combustion process utilizing $H_2$ and $O_2$ gases to provide oxygen radicals (O*), performed at a low pressure of about 10 Torr and at a temperature of between about 700° C. and about 1050° C.

In some embodiments, the silicon oxide layer 316 consumes the silicon nitride layer 314 having the concentration gradient of nitrogen to a depth of between about 0.5 nm and about 4 nm, for example, at the interface on the protective interlayer oxide 312.

In some other embodiments, the bottom nitrogen-rich silicon nitride layer 314A of the bi-layer at the interface on the protective interlayer oxide 312 is fully oxidized and densified where stoichiometric and structural defects due to nitrogen are minimized. Using a low temperature oxidation process at a temperature of between about 25° C. and about 250° C., the top silicon nitride layer 314A' may be fully converted to a silicon oxide layer to eliminate nitrogen in the top silicon nitride layer 314A'.

In some other embodiments, the bottom silicon nitride layer 314B of the hybrid layer at the interface on the protective interlayer oxide 312 is oxidized.

In block 240, an optional post oxidation densification treatment is performed to densify (e.g., eliminate nitrogen and re-order bond structures within) the silicon oxide layer 316.

The post oxidation densification treatment may be a plasma treatment, such as a decoupled plasma (DPHe) process and a remote plasma oxidation (RPO2) process, performed for between about 10 seconds and about 200 seconds, at a temperature of between about 400° C. and about 650° C.

In the embodiments described herein, the bWL structure 300 having the trenches 304 is used as an example structure that may benefit from the method 200 for forming a high quality thin oxide layer. The method 200 may also be used to form a high quality thin oxide layer in a structure having convex shaped features (e.g., protrusion) or flat features, such as in a thin nanowire field-effect-transistor (FET).

In the embodiments described herein methods of forming a high quality thin oxide layer in a semiconductor device, such as a buried wordline (bWL) used in a dynamic random access memory (DRAM) device, and a thin nanowire thin nanowire field-effect-transistor (FET), are provided. In the methods described herein, a thin oxide layer may be formed by first depositing a silicon nitride layer on a substrate and then oxidizing the silicon nitride layer by a conversion process. The methods described herein for forming an oxide layer may reduce silicon consumption and increase quality of the formed oxide layer. The methods described herein also provide the capability of tuning a thickness and nitride content distribution of the formed oxide layer.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an oxide layer, comprising:
   forming a protective interlayer oxide on a surface of a substrate;
   forming a silicon nitride layer on the protective interlayer oxide, by a plasma-enhanced atomic layer deposition (PE ALD) process utilizing nitrogen-containing process gas, the silicon nitride layer having a concentration gradient of nitrogen varying from high concentration away from the protective interlayer oxide to low concentration near the protective interlayer oxide; and
   performing a conversion process to oxidize the formed silicon nitride layer to at least partially convert the formed silicon nitride layer to a silicon oxide layer.

2. The method of claim 1, further comprising:
   performing a densification treatment to densify the silicon oxide layer.

3. The method of claim 2, wherein the densification treatment is a decoupled plasma process or a remote plasma oxidation process.

4. The method of claim 1, wherein the nitrogen-containing process gas comprises at least one of nitrogen ($N_2$) gas and ammonia ($NH_3$) gas.

5. The method of claim 1, wherein the silicon nitride layer comprises silicon nitride ($Si_3N_4$) having a thickness of between 5 Å and 25 Å.

6. The method of claim 1, wherein the protective interlayer oxide comprises silicon oxide ($SiO_2$) having a thickness of between 5 Å and 15 Å.

7. The method of claim 1, wherein the conversion process comprises a plasma radical oxidation process utilizing an oxidizing agent including oxygen ($O_2$) and a source gas including any combination of hydrogen ($H_2$), argon (Ar), and helium (He).

8. The method of claim 1, wherein the conversion process comprises in-situ steam generation (ISSG) process utilizing hydrogen ($H_2$) and oxygen ($O_2$) gases.

9. The method of claim 1, wherein the substrate includes trenches, and forming the protective interlayer oxide on the surface of the substrate comprises forming the protective interlayer oxide on sidewalls of the trenches.

10. A method for forming an oxide layer, comprising:
    forming a protective interlayer oxide on a surface of a substrate;
    forming a bi-layer of a bottom nitrogen-rich silicon nitride layer on the protective interlayer oxide and a top silicon nitride layer on the bottom nitrogen-rich silicon nitride layer, by an atomic layer deposition (ALD) process; and
    performing a conversion process to oxidize the formed bottom nitrogen-rich silicon nitride layer to convert the formed bottom nitrogen-rich silicon nitride layer to a silicon oxide layer.

11. The method of claim 10, further comprising:
    performing a densification process to densify the silicon oxide layer.

12. The method of claim 10, wherein the bottom nitrogen-rich silicon nitride layer has nitrogen concentration of between 15 atomic percent (at %) and 60 at %, and the top silicon nitride layer has nitrogen concentration of between 5 atomic percent (at %) and 25 at %.

13. The method of claim 10, wherein the protective interlayer oxide comprises silicon oxide ($SiO_2$) having a thickness of between 5 Å and 15 Å.

14. The method of claim 10, wherein the conversion process comprises a plasma radical oxidation process utilizing an oxidizing agent including oxygen ($O_2$) and a source gas including any combination of hydrogen ($H_2$), argon (Ar), and helium (He).

15. The method of claim 10, wherein the conversion process comprises in-situ steam generation (ISSG) process utilizing hydrogen ($H_2$) and oxygen ($O_2$) gases and a source gas including any combination of hydrogen ($H_2$), argon (Ar), and helium (He).

16. The method of claim 10, wherein the substrate includes trenches, and forming the protective interlayer oxide on the surface of the substrate comprises forming the protective interlayer oxide on sidewalls of the trenches.

17. A method for forming an oxide layer, comprising:
    forming a protective interlayer oxide on a surface of a substrate; and
    forming a hybrid-layer of a bottom silicon nitride layer on layer on the protective interlayer oxide and a top silicon oxide layer on the bottom silicon nitride layer, by an atomic layer deposition (ALD) process; and
    performing a conversion process to oxidize the formed bottom silicon nitride layer to convert the formed bottom silicon nitride layer to a silicon oxide layer.

18. The method of claim 17, further comprising:
    performing a densification process.

19. The method of claim 17, wherein the bottom silicon nitride layer has a thickness of between 5 Å and 20 Å, and the top silicon oxide layer has a thickness of between 5 Å and 20 Å.

20. The method of claim 19, wherein the protective interlayer oxide comprises silicon oxide ($SiO_2$) having a thickness of between 5 Å and 15 Å.

21. The method of claim 17, wherein the conversion process comprises a plasma radical oxidation process utilizing an oxidizing agent including oxygen ($O_2$) and a source gas including any combination of hydrogen ($H_2$), argon (Ar), and helium (He).

22. The method of claim 17, wherein the conversion process comprises in-situ steam generation (ISSG) process utilizing hydrogen ($H_2$) and oxygen ($O_2$) gases and a source gas including any combination of hydrogen ($H_2$), argon (Ar), and helium (He).

23. The method of claim 17, wherein the substrate includes trenches, and forming the protective interlayer oxide on the surface of the substrate comprises forming the protective interlayer oxide on sidewalls of the trenches.

* * * * *